(12) United States Patent
Shei et al.

(10) Patent No.: US 6,914,268 B2
(45) Date of Patent: Jul. 5, 2005

(54) LED DEVICE, FLIP-CHIP LED PACKAGE AND LIGHT REFLECTING STRUCTURE

(75) Inventors: Shih-Chang Shei, Tainan County (TW); Jinn-Kong Sheu, Tainan (TW)

(73) Assignee: South Epitaxy Corporation, Tainan (TW)

( * ) Notice: Subject to any disclaimer, the term of this patent is extended or adjusted under 35 U.S.C. 154(b) by 0 days.

(21) Appl. No.: 10/708,203

(22) Filed: Feb. 16, 2004

(65) Prior Publication Data

US 2005/0017262 A1 Jan. 27, 2005

(51) Int. Cl.[7] .............................................. H01L 33/00
(52) U.S. Cl. ................................................... 257/99
(58) Field of Search ........................... 257/12, 13, 14, 257/15, 16, 17, 18, 19, 79, 94, 95, 96, 97, 98, 99, 100, 101, 102, 103

(56) References Cited

U.S. PATENT DOCUMENTS 6,497,944 B1 * 12/2002 Oku et al.
6,791,119 B2 * 9/2004 Slater et al.
2002/0163302 A1 * 11/2002 Nitta et al.
2004/0113156 A1 * 6/2004 Tamura et al.

* cited by examiner

*Primary Examiner*—Nathan J. Flynn
*Assistant Examiner*—Kevin Quinto
(74) *Attorney, Agent, or Firm*—Jiang Chyun IP office

(57) ABSTRACT

A light emitting diode (LED) device is provided. The LED device includes a device substrate, a first doped layer of a first conductivity type, a light emitting layer, a second doped layer of a second conductivity type, a transparent conductive oxide layer, a reflecting layer and two electrodes. The first doped layer is deposited on the device substrate, the light emitting layer is deposited on a portion of the first doped layer, and the second doped layer is deposited on the light emitting layer. The first and the second doped layers are comprised of III–V semiconductor material respectively. The transparent conductive oxide layer is deposited on the second doped layer, and the reflecting layer is deposited on the transparent conductive oxide layer. The two electrodes are deposited on the reflecting layer and the first doped layer respectively.

24 Claims, 2 Drawing Sheets

US 6,914,268 B2

LED DEVICE, FLIP-CHIP LED PACKAGE AND LIGHT REFLECTING STRUCTURE

CROSS REFERENCE TO RELATED APPLICATIONS

This application claims the priority benefit of Taiwan application serial no.92120195, filed on Jul. 24, 2003.

BACKGROUND OF INVENTION

1. Field of the Invention

The invention relates in general to a structure of a semiconductor light emitting device, and more particularly, to a structure of a light emitting diode (LED) device, to a package structure of a flip-chip LED device, and to a light reflective structure being applicable for a LED.

2. Related Art of the Invention

In general, a light emitting diode (LED) constructed by an III–V semiconductor material can be provided as a wide bandgap light emitting device. The wavelength of the light emitted from the wide bandgap light emitting device ranges from infrared (IR) to ultraviolet (UV); therefore the entire spectrum of visible light is also covered. In recent years, due to the rapid development of the high illumination of the gallium nitride (GaN) LEDs having a blue/green light, the full-color LED display, white light LED and the LED for traffic signals are put into practice. Therefore, the application of a variety of LED also becomes more popular.

In principle, a fundamental structure of a LED device includes an epitaxy layer of a P-type and a N-type III–V group compound and a light emitting layer in-between. The light emitting efficiency of the LED device is dependent on the internal quantum efficiency of the light emitting layer and the light extraction efficiency of the device. A method of increasing the internal quantum efficiency includes, for the most part, improving the quality of the light emitting layer and the design of the structure. The method of increasing the light extraction efficiency includes, for the most part, decreasing the light loss caused by the absorption of the light emitted from the light emitting layer due to the reflection of the light inside the LED device.

In a conventional gallium nitride (GaN) LED device grown on the first substrate, such as sapphire, having an insulating property, since the positive and the negative electrodes of a gallium nitride (GaN) LED device are deposited on, in general, the same side of a first surface, and the positive electrode will screen out the emitted light from light emitting layer. Therefore, the packaging for a gallium nitride (GaN) LED normally uses the flip chip method. Thus, the emitted light will pass through the second surface. Moreover, a reflecting layer is formed on the topmost surface of GaN LED that faces the second substrate, in order to emit most of the emitted light towards the second surface of a GaN LED. Another advantage of using the flip-chip package process is, if a proper surface mount (so called surmount) substrate, for example, a silicon substrate is provided, the heat dissipation of the LED device is enhanced, especially under a high current operation. Accordingly, not only the light extraction efficiency is increased, the internal quantum efficiency of the light emitting layer will also be maintained.

Moreover, in order to improve the electrical property of the LED device, a semi-transparent nickel (Ni)/gold (Au) ohmic contact layer is first formed on the epitaxy layer surface, and a thermal process is performed to form a desirable ohmic contact, followed by forming a reflecting layer thereon. However, since the absorption of light of the Ni/Au layer is high (the transparency of that is about 60% to about 70%), and due to the thermal process, the interface between the epitaxy layer and the Ni/Au layer becomes too rough to reflect light. Accordingly, the light reflective efficiency of the bottom of the flip-chip LEDs device will be reduced.

SUMMARY OF INVENTION

Accordingly, the present invention is to provide a light reflective structure, which is applicable for a LED device to enhance the extraction efficiency of light.

Another object of the present invention is to provide a LED device having a light reflective structure of the present invention, wherein the extraction efficiency of light is enhanced.

It is yet another object of the present invention to provide a flip-chip LED package structure having a light reflective structure of the present invention, wherein the extraction efficiency of light is enhanced.

In order to achieve the above objects and other advantages of the present invention, a light reflective structure for a LED device is provided. The light reflective structure includes, for example but not limited to, a transparent conductive oxide layer deposited on a semiconductor layer, a transparent insulating layer deposited on the transparent conductive oxide layer, and a reflecting layer deposited on the transparent insulating layer. The transparent conductive oxide layer is provided as an ohmic contact layer for the semiconductor layer. The transparent insulating layer is provided as a passivation layer for the transparent conductive oxide layer. When the wavelength of the light emitted from the LED device is $\lambda$, and the refractive index of the transparent conductive oxide layer is n, the thickness of the transparent conductive oxide layer is preferably to be $(2m+1)\lambda/2n$ (m is 0 or an positive integer). When the refractive index of the transparent insulating layer is k, the thickness of the transparent insulating layer is preferably to be $(2m+1)\lambda/2k$ (m is 0 or an positive integer). Therefore, a constructive interference of the lights is achieved.

In order to achieve the above objects and other advantages of the present invention, a light reflective structure applicable for a LED device is provided. The light reflective structure includes a transparent conductive oxide layer deposited on a semiconductor layer, and a reflecting layer deposited on the transparent conductive oxide layer. The transparent conductive oxide layer is provided as an ohmic contact layer for the semiconductor layer. When the wavelength of the light emitted from the LED device is $\lambda$, and the refractive index of the transparent conductive oxide layer is n, the thickness of the transparent conductive oxide layer is preferably to be $(2m+1)\lambda/2n$ (m is 0 or a positive integer). Therefore, a constructive interference of the lights is achieved.

The LED device of the present invention includes a first substrate called device substrate, a first doped layer, a light emitting layer, a second doped layer, a transparent conductive oxide layer, a reflecting layer, and two electrodes. The first doped layer is deposited on the device substrate, the light emitting layer is deposited on the first doped layer, and the second doped layer is deposited on the light emitting layer. The second doped layer and the first doped layer are constructed from an III–V group compound of semiconductor material with different conductivity type. The transparent conductive oxide layer is deposited on the second doped layer, and is provided as an ohmic contact layer. The transparent insulating layer is deposited on the ohmic contact layer to serves as a passivation layer. The reflecting layer is deposited on the transparent insulating layer. The two electrodes are formed on the reflecting layer and the first doped layer, respectively.

The LED device of the present invention includes a first substrate called device substrate, a first doped layer, a light emitting layer, a second doped layer, a transparent conductive oxide layer, a reflecting layer, and two electrodes. The first doped layer is deposited on the device substrate, the light emitting layer is deposited on the first doped layer, and the second doped layer is deposited on the light emitting layer. The second doped layer and the first doped layer are constructed from an III–V group compound of semiconductor material with different conductivity type. The transparent conductive oxide layer is deposited on the second doped layer, and is provided as an ohmic contact layer. The reflecting layer is deposited on the transparent conductive oxide layer. The two electrodes are formed on the reflecting layer and the first doped layer, respectively.

The flip-chip LED package structure of the present invention includes a package substrate called second substrate or submount substrate and a LED structure on the first substrate, in which the LED is faced-down over the package substrate and is electrically connected to the package substrate. The LED includes a first substrate (device substrate), a first doped layer, a light emitting layer, a second doped layer, a transparent conductive oxide layer, a transparent insulating passivation layer, a reflecting layer, and two electrodes. The first doped layer is deposited on the first substrate, the light emitting layer is deposited on the first doped layer, and the second doped layer is deposited on the light emitting layer. The second doped layer and the first doped layer are constructed from an III–V group compound of semiconductor material with different conductivity type. The transparent conductive oxide layer is deposited on the second doped layer, and is provided as an ohmic contact layer. The transparent insulating layer is deposited on the ohmic contact layer to serves as a passivation layer. The reflecting layer is deposited on the transparent insulating layer. The two electrodes are deposited on the reflecting layer and the first doped layer, respectively.

The flip-chip LED package structure of the present invention includes a package substrate called second substrate or submount substrate and a LED structure on the first substrate, in which the LED is faced-down over the package substrate and is electrically connected to the package substrate. The LED includes a first substrate (device substrate), a first doped layer, a light emitting layer, a second doped layer, a transparent conductive oxide layer, a reflecting layer, and two electrodes. The first doped layer is deposited on the first substrate, the light emitting layer is deposited on the first doped layer, and the second doped layer is deposited on the light emitting layer. The second doped layer and the first doped layer are constructed from an III–V group compound of semiconductor material with different conductivity type. The transparent conductive oxide layer is deposited on the second doped layer, and is provided as an ohmic contact layer. The reflecting layer is deposited on the transparent insulating layer. The two electrodes are deposited on the reflecting layer and the first doped layer, respectively.

Accordingly, in the present invention, the material of the ohmic contact layer includes a transparent conductive metal oxide, and a thermal process for achieving a good ohmic contact is not required for the transparent conductive metal oxide. Therefore, the interface between the ohmic contact layer and the second doped layer is smooth, and thus the interface can be provided as a reflecting surface. Moreover, in the present invention, the absorption to visible light of the transparent conductive metal oxide can be reduced to less than 10% (for example, when the oxide is an indium tin oxide (ITO; therefore, the absorption of the ohmic contact layer to the LED device is reduced drastically.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
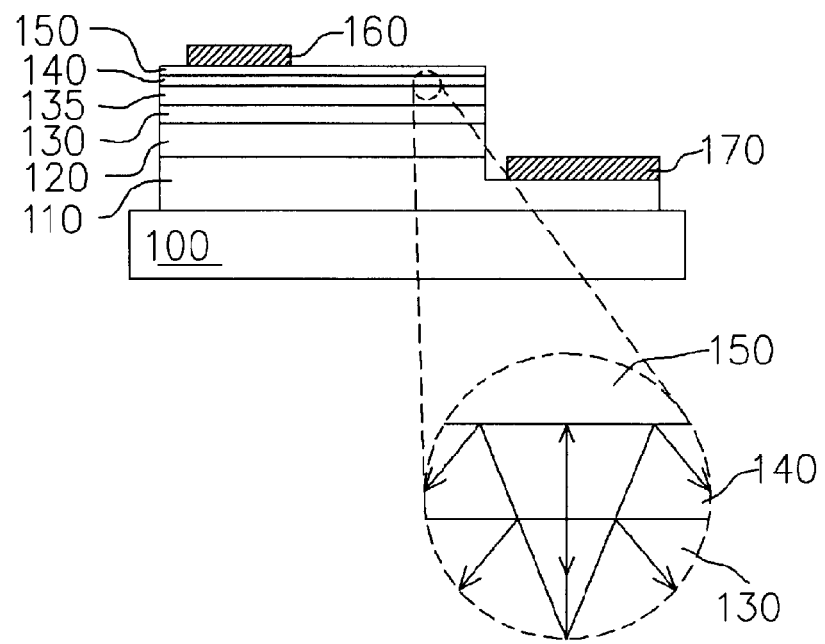
FIG. 1 is a cross-sectional view illustrating a structure of a LED device and a enlarged view of a portion adjacent to a interface of the transparent conductive oxide layer of the LED device according to a preferred embodiment of the present invention.

FIG. 1 is a cross-sectional view illustrating a structure of a LED device and a enlarged view of a portion adjacent to a interface of the transparent conductive oxide layer of the LED device according to a preferred embodiment of the present invention. Referring to FIG. 1, the LED device includes a device substrate 100, a N-type doped layer 110, a light emitting layer 120, a P-type doped layer 130, a strained-layer superlattice (SLS) contact layer 135, a transparent conductive oxide layer 140, a reflecting layer 150, and an anode 160 and a cathode 170. In FIG. 1, an active layer constructed by a N-type doped layer 110, a light emitting layer 120 and a P-type doped layer 130 is formed, for example but not limited to, by performing a series of epitaxy processes sequentially on the device substrate 100. Moreover, in the succeeding process, a portion of the N-type doped layer 110, a portion of the light emitting layer 120 and a portion of the P-type doped layer 130 are removed, for example but not limited to, by etching or by another method. Therefore, each of the layers 110, 120, 130 and 135 are patterned to form a plurality of isolated island structure (MESA). It is noticed that, in the isolated island structure above, a portion of the P-type doped layer 130 and SLS contact layer 135 over the cathode 170, the light emitting layer 120 and a portion of the N-type doped layer 110 are removed. The cathode 170 thus can be electrically connected with the N-type doped layer 110.

Referring to FIG. 1, in the present embodiment, the transparent conductive oxide layer 140 is deposited on the SLS contact layer 135, while the reflecting layer 150 is deposited on the transparent conductive oxide layer 140 and the anode 160 is deposited on the reflecting layer 150.

The device substrate 100 includes, for example but not limited to, a sapphire substrate. The materials of the N-type doped layer 110, light emitting layer 120, the P-type doped layer 130, and SLS contact layer 135 are comprised of a III–V group compound of semiconductor material, including but not limited to, a gallium nitride (GaN), a gallium phosphide (GaP) or a gallium phosphide arsenide (GaAsP). The light emitting layer 120 includes, for example but not limited to, a single or a multi quantum well structure, to enhance the light emitting efficiency. A material of the transparent conductive oxide layer 140 preferably includes an indium tin oxide (ITO), but also may include, for example but not limited to, such as ITO, CTO, IZO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$, and so on or other transparent conductive material having similar properties. A material of the reflecting layer 150 includes, for example but not limited to, an aluminum (Al), a silver (Ag), Ni/Ag, Ni/Al, Mo/Ag, Mo/Al, Ti/Ag, Ti/Al, Nd/Al, Nd/Ag, Pd/Al, Pd/Ag, Cr/Al, Cr/Ag and materials of the anode 160 and the cathode 170 include, for example but not limited to, a bi-layer or tri-layer metal system, such as Cr/Au, Ti/Au, Cr/Pt/Au and Ti/Pt/Au.

As shown in the enlarged view of FIG. 1, since the transparent conductive oxide layer 140 does not require a thermal process for increasing the ohm contact efficiency, the interface between the transparent conductive oxide layer 140 and the SLS contact layer 135 is smooth. A desirable reflecting effect is thereby achieved. Moreover, according to the theory of light interference, when the light emitting wavelength of the LED device is $\lambda$, and the refractive index of the transparent conductive oxide layer 140 is n, the thickness of the transparent conductive oxide layer 140 is preferably to be $(2m+1)\lambda/2n$ (m is 0 or an positive integer such as 1, 2, 3, etc.). Thus, the reflecting light from the interface between the transparent conductive oxide layer 140 and the reflecting layer 150, and the reflecting light from the interface of the SLS contact layer 135 and the transparent conductive oxide layer 140 can generate a constructive interference effect.

Figure 2:
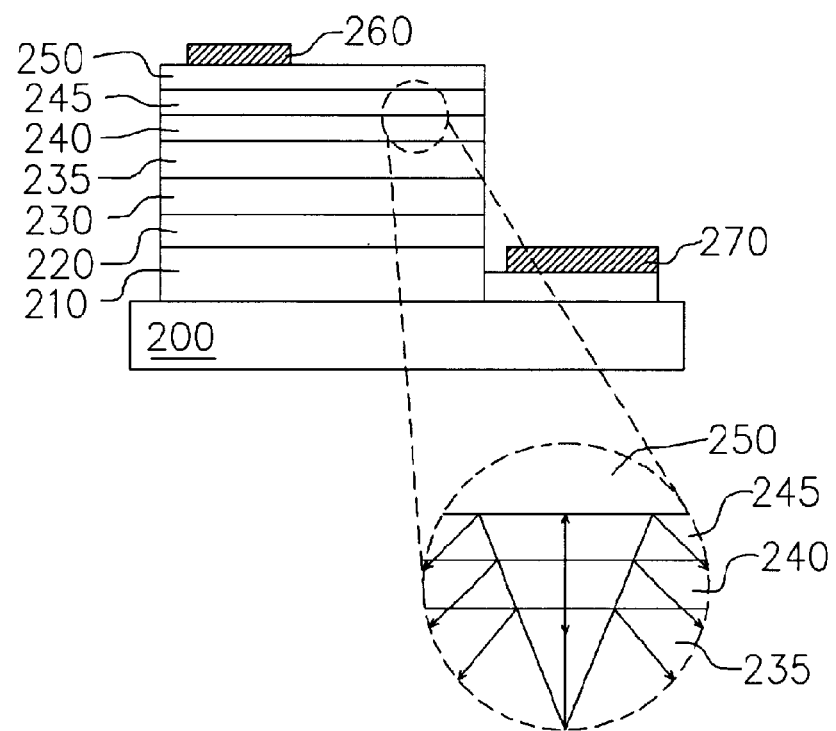
FIG. 2 is a cross-sectional view illustrating another structure of a LED device.

FIG. 2 is a cross-sectional view illustrating another structure of a LED device. Referring to FIG. 2, the LED device includes a device substrate 200, a N-type doped layer 210, a light emitting layer 220, a P-type doped layer 230, a strained-layer superlattice (SLS) contact layer 235, a transparent conductive oxide layer 240, a transparent insulating passivation layer 245, a reflecting layer 250, and an anode 260 and a cathode 270. In FIG. 2, an active layer constructed by a N-type doped layer 210, a light emitting layer 220 and a P-type doped layer 230 is formed, for example but not limited to, by performing a series of epitaxy processes sequentially on the device substrate 200. Moreover, in the succeeding process, a portion of the N-type doped layer 210, a portion of the light emitting layer 220, a portion of the P-type doped layer 230 and a SLS contact layer 235 are removed, for example but not limited to, by etching or by another method. Therefore, each of the layers 210, 220, 230 and 235 are patterned to form a plurality of isolated island structure (MESA). It is noticed that, in the isolated island structure above, a portion of the P-type doped layer 230 and SLS contact layer 235 over the cathode 270, the light emitting layer 220 and a portion of the N-type doped layer 210 are removed. The cathode 270 thus can be electrically connected with the N-type doped layer 210.

Referring to FIG. 2, in the present embodiment, the transparent conductive oxide layer 240 is deposited on the SLS contact layer 235, and the transparent insulating passivation layer 245 is deposited on the transparent conductive oxide layer 240 while the reflecting layer 250 is deposited on the transparent insulating passivation layer 245 and the anode 260 is deposited on the reflecting layer 250.

The device substrate 200 includes, for example but not limited to, a sapphire substrate. The materials of the N-type doped layer 210, light emitting layer 220, the P-type doped layer 230, and SLS contact layer 235 are comprised of a III–V group compound of semiconductor material, including but not limited to, a gallium nitride (GaN), a gallium phosphide (GaP) or a gallium phosphide arsenide (GaAsP). The light emitting layer 220 includes, for example but not limited to, a single or a multi quantum well structure, to enhance the light emitting efficiency. A material of the transparent conductive oxide layer 140 preferably includes an indium tin oxide (ITO), but also may include, for example but not limited to, such as ITO, CTO, IZO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$, and so on. or other transparent conductive material having similar properties. A material of the transparent insulating passivation layer 245 includes, for example but not limited to, a $SiO_2$, $SiN_x$, $Al_2O_3$, AlN, BeO, ZnO, and so on. A material of the reflecting layer 250 includes, for example but not limited to, an aluminum (Al), a silver (Ag), Ni/Ag, Ni/Al, Mo/Ag, Mo/Al, Ti/Ag, Ti/Al, Nd/Al, Nd/Ag, Pd/Al, Pd/Ag, Cr/Al, Cr/Ag and materials of the anode 260 and the cathode 270 include, for example but not limited to, a bi-layer or tri-layer metal system, such as Cr/Au, Ti/Au, Cr/Pt/Au and Ti/Pt/Au.

As shown in the enlarged view of FIG. 2, since the transparent conductive oxide layer 240 does not require a thermal process for increasing the ohm contact efficiency, the interface between the transparent conductive oxide layer 240 and the SLS contact layer 235 is smooth. A desirable reflecting effect is thereby achieved. Moreover, according to the theory of light interference, when the light emitting wavelength of the LED device is $\lambda$, and the refractive index of the transparent conductive oxide layer 140 is n, the thickness of the transparent conductive oxide layer 240 is preferably to be $(2m+1)\lambda/2n$ (m is 0 or an positive integer such as 1, 2, 3, etc.). Moreover, according to the theory of light interference, when the light emitting wavelength of the LED device is $\lambda$, and the refractive index of the transparent insulating passivation layer 245 is k, the thickness of the transparent insulating passivation layer 245 is preferably to be $(2m+1)\lambda/2k$ (m is 0 or an positive integer such as 1, 2, 3, etc.). Thus, the reflecting light from the interface between the transparent insulating passivation layer 245 and the reflecting layer 250, and the reflecting light from the interface of the SLS contact layer 235 and the transparent conductive oxide layer 240 can generate a constructive interference effect.

Figure 3:
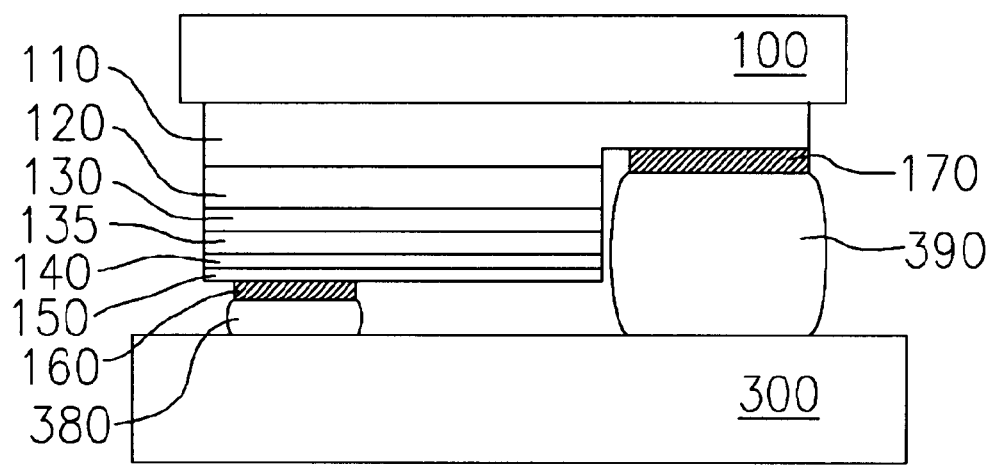
FIG. 3 is a cross-sectional view illustrating a flip-chip LED package structure achieved after a flip-chip package process of the LED device of FIG. 1 and FIG. 2.

FIG. 3 is a cross-sectional view illustrating a flip-chip LED package structure obtained after the flip-chip packaging of the LED device of FIG. 1 and FIG. 2. Referring to FIG. 3, the LED device of FIG. 1 or FIG. 2 is flipped over a package substrate 300, the package substrate 300 includes, for example but not limited to, a silicon substrate. The LED device of FIG. 1 and the package substrate 300 are electrically connected via a bump 380 and a bump 390. The bump 380 is electrically connected with the anode 160 and the package substrate 300, and the bump 390 is electrically connected with the cathode 170 and the package substrate 300. Since the reflecting layer 150 is between the top layer of the FIG. 1 and the package substrate 300, and faces to the package substrate 200. Thus, the light emitted from the light emitting layer 120 is reflected by the multi-layer structures including the layer 135, layer 140, and layer 150 and emits through the device substrate 100. Similar concept is also suitable for a device consisting of a transparent insulating passivation layer, as shown in FIG. 2.

Moreover, the device structure of the embodiments described above, for example, a LED device having a flip-chip package structure, is only an example for describing the present invention. The scope of the invention is not limited to the above embodiments. Moreover, the present invention can also be provided for all of the LED devices that are formed with an ohmic contact layer and a reflecting layer and are packaged by a process other than the flip-chip package process for increasing the light reflecting efficiency. In addition, although the present invention is described with a N-type doped layer being formed on the device substrate, and a P-type doped layer being formed on the light emitting layer and, the present invention is also applicable with the conductive type of the doped layers being exchanged. That is, a P-type doped layer is formed on the device substrate, and a N-type doped layer is formed on the light emitting layer. Therefore, the electrode formed on the reflecting layer is served as a cathode, and the electrode formed on the P-type doped layer is served as an anode.

In accordance to the present invention, the material of the ohmic contact layer includes a transparent conductive metal oxide, wherein a thermal process for increasing the ohmic contact efficiency is not required for the transparent conductive metal oxide. Therefore, the interface between the ohmic contact layer and the SLS contact layer is smooth, and thus the interface can be provided as a reflecting surface. Moreover, in the present invention, the absorption to visible light of the transparent conductive metal oxide can be reduced to less than 10% (for example, when the oxide is a indium tin oxide (ITO); therefore, the absorption of the ohmic contact layer to the LED device is reduced drastically.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) device, comprising:
   a device substrate;
   a first doped layer, formed on the device substrate;
   a light emitting layer, formed on the first doped layer;
   a second doped layer, formed on the light emitting layer, wherein the second doped layer and the first doped layer are comprised of a semiconductor material of a III–V group compound with different conductivity type;
   a strained-layer superlattice contact layer
   a transparent conductive oxide layer as an ohmic contact layer, wherein the transparent conductive oxide layer is deposited on the strained-layer superlattice contact layer, wherein a thickness of the transparent conductive oxide layer is $(2m+1)\lambda/2n$ (m is 0 or a positive integer), wherein $\lambda$ is a wavelength of a light emitted from the light emitting layer and n is a refractive index of the transparent conductive oxide layer;
   a reflecting layer, deposited on the transparent conductive oxide layer; and
   two electrodes, formed on the reflecting layer and a portion of the first doped layer, respectively.

2. The LED device of claim 1, wherein the strained-layer superlattice contact layer comprise n-type or p-type III–V semiconductor multi-layer structures.

3. The LED device of claim 1, wherein the semiconductor material of the III–V group compound is gallium nitride (GaN), gallium phosphide (GaP) or gallium phosphide arsenide (GaAsP).

4. The LED device of claim 1, wherein the light emitting layer comprise a quantum-well light emitting layer.

5. The LED device of claim 1, wherein a material of the transparent conductive oxide layer is indium tin oxide (ITO), cerium tin oxide (CTO), antimony tin oxide (ATO), aluminum zinc oxide (AZO) indium zinc oxide (IZO), zinc oxide (ZnO), cadmium tin oxide, $ZnGa_2O_4$, $SnO_2$:Sb, $Ga_2O_3$:Sn, $AgInO_2$:Sn, $In_2O_3$:Zn, $CuAlO_2$, LaCuOS, NiO, or $CuGaO_2$, $SrCu_2O_2$.

6. The LED device of claim 1, wherein the first doped layer is comprised of a N-type doped layer, and the second doped layer is comprised of a P-type doped layer.

7. The LED device of claim 1, wherein the first doped layer is comprised of a P-type doped layer, and the second doped layer is comprised of a N-type doped layer.

8. A light emitting diode (LED) device, comprising:
   a device substrate;
   a first doped layer, formed on the device substrate;
   a light emitting layer, formed on the first doped layer;
   a second doped layer, formed on the light emitting layer, wherein the second doped layer and the first doped layer are comprised of a semiconductor material of a III–V group compound with different conductivity type;
   a strained-layer superlattice contact layer;
   a transparent conductive oxide layer as an ohmic contact layer, wherein the transparent conductive oxide layer is deposited on the strained-layer superlattice contact layer;
   a transparent insulating layer as a passivation layer, wherein the transparent insulating layer is deposited on transparent conductive oxide layer;
   a reflecting layer, deposited on the transparent insulating layer and a portion of the transparent conductive oxide layer; and
   two electrodes, formed on the reflecting layer and a portion of the first doped layer, respectively.

9. The LED device of claim 8, wherein a thickness of the transparent conductive oxide layer is $(2m+1)\lambda/2m$ (in is 0 or a positive integer), wherein $\lambda$ is a wavelength of a light emitted from the light emitting layer and n is a refractive index of the transparent conductive oxide layer.

10. The LED device of claim 8, wherein a thickness of the transparent insulating layer is $(2m+1)\lambda/2k$ (m is 0 or a positive integer), wherein $\lambda$ is a wavelength of a light emitted from the light emitting layer and k is a refractive index of the transparent insulating layer.

11. The LED device of claim 8, wherein the strained-layer superlattice contact layer comprise n-type or p-cype III–V semiconductor multi-layer structures.

12. The LED device of claim 8, wherein the semiconductor material of the III–V group compound is gallium nitride (GaN), gallium phosphide (GaP) or gallum phosphide arsenide (GaAsP).

13. The LED device of claim 8, wherein the light emitting layer comprise a quantum-well light emitting layer.

14. The LED device of claim 8, wherein a material of the transparent conductive oxide layer is indium tin oxide (ITO), cerium tin oxide (CTO), antimony tin oxide (ATO), aluminum zinc oxide (AZO) indium zinc oxide (IZO), zinc oxide (ZnO), cadmium tin oxide, $ZnGa_2O_4$, $SnO_2$:Sb, $Ga_2O_3$:Sn, $AgInO_2$:Sn, $In_2O_3$:Zn, $CuAlO_2$, LaCuOS, NiO, or $CuGaO_2$, $SrCu_2O_2$.

15. The LED device of claim 8, wherein a material of the transparent conductive oxide layer is $SiO_2$, $SiN_x$, $Al_2O_3$, AlN, BeO, ZnO.

16. The LED device of claim 8, wherein the first doped layer is comprised of a N-type doped layer, and the second doped layer is comprised of a P-type doped layer.

17. The LED device of claim 8, wherein the first doped layer is comprised of a P-type doped layer, and the second doped layer is comprised of a N-type doped layer.

18. A flip-chip light emitting diode (LED) package structute comprising:
a package substrate; and
a LED device, faced-down and flipped on the package substrate and electrically connected to the package substrate, wherein the LED device comprises:
a device substrate;
a first doped layer, formed on the device substrate;
a light emitting layer, formed on the first doped layer;
a second doped layer, formed on the light emitting layer, wherein the second doped layer and the first doped layer are comprised of a semiconductor material of a III–V group compound with different conductivity type;
a strained-layer superlattice contact layer
a transparent conductive oxide layer as an ohmic contact layer, wherein the transparent conductive oxide layer is deposited on the strained-layer superlattice contact layers, wherein a thickness of the transparent conductive oxide layer is $(2m+1)\lambda/2n$ (m is 0 or a positive integer), wherein $\lambda$ is a wavelength of a light emitted from the light emitting layer and n is a refractive index of the transparent conductive oxide layer;
a reflecting layer, deposited on the transparent conductive oxide layer; and
two electrodes, formed on the reflecting layer and a portion of the first doped layer, respectively.

19. A flip-chip light emitting diode (LED) package structure, comprising:
a package substrate; and
a LED device, faced-down and flipped on the package substrate and electrically connected to the package substrate, wherein the LED device comprises:
a device substrate;
a first doped layer, formed on the device substrate;
a light emitting layer, formed on the first doped layer;
a second doped layer, formed on the light emitting layer, wherein the second doped layer and the first doped layer are comprised of a semiconductor material of a III–V group compound with different conductivity type;
a strained-layer superlattice contact layer;
a transparent conductive oxide layer as an ohmic contact layer, wherein the transparent conductive oxide layer is deposited on the strained-layer superlattice contact layer;
a transparent insulating layer as a passivation layer, wherein the transparent insulating layer is deposited on transparent conductive oxide layer;
a reflecting layer, deposited on the transparent insulating layer and a portion of the transparent conductive oxide layer; and
two electrodes, formed on the reflecting layer and a portion of the first doped layer, respectively.

20. The flip-chip LED package structure of claim 19, wherein a thickness of the transparent conductive oxide layer is $(2m+1)\lambda/2n$ (m is 0 or a positive integer), wherein $\lambda$ is a wavelength of a light emitted from the light emitting layer and n is a refractive index of the transparent conductive oxide layer.

21. The flip-chip LED package structure of claim 19, wherein a thickness of the transparent insulating layer is $(2m+1)\lambda/2k$ (m is 0 or a positive integer), wherein is a wavelength of a light emitted from the light emitting layer and k is a refractive index of the transparent insulating layer.

22. A light reflective structure for a light emitting diode (LED), comprising:
a transparent conductive oxide layer deposited on a semiconductor layer;
a transparent insulating layer deposited on the transparent conductive oxide layer; and
a reflecting layer deposited on the transparent insulating layer.

23. The light reflective structure of claim 22, wherein a thickness of the transparent conductive oxide layer is $(2m+1)\lambda/2n$ (m is 0 or a positive integer), wherein $\lambda$ is a wavelength of a light emitted from the light emitting layer and n is a refractive index of the transparent conductive oxide layer.

24. The LED device of claim 22, wherein a thickness of the transparent insulating layer is $(2m+1)\lambda/2k$ (m is 0 or a positive integer), wherein $\lambda$ is a wavelength of a light emitted from the light emitting layer and k is a refractive index of the transparent insulating layer.

* * * * *